(12) United States Patent
Murata

(10) Patent No.: US 6,915,049 B2
(45) Date of Patent: Jul. 5, 2005

(54) OPTICAL MODULE AND METHOD OF MANUFACTURING THE SAME, AND OPTICAL TRANSMISSION DEVICE

(75) Inventor: Akihiro Murata, Yamanashi-ken (JP)

(73) Assignee: Seiko Epson Corporation, Tokyo (JP)

( * ) Notice: Subject to any disclaimer, the term of this patent is extended or adjusted under 35 U.S.C. 154(b) by 260 days.

(21) Appl. No.: 10/078,698

(22) Filed: Feb. 21, 2002

(65) Prior Publication Data

US 2002/0118924 A1 Aug. 29, 2002

(30) Foreign Application Priority Data

Feb. 26, 2001 (JP) ........................................ 2001-049775

(51) Int. Cl.[7] ................................................ G02B 6/42
(52) U.S. Cl. ............................ 385/52; 385/88; 385/93
(58) Field of Search ........................ 385/14, 52, 92–94

(56) References Cited

U.S. PATENT DOCUMENTS

| | | | | |
|---|---|---|---|---|
| 3,968,564 A | * | 7/1976 | Springthorpe | 438/27 |
| 4,268,113 A | * | 5/1981 | Noel, Jr. | 385/92 |
| 4,727,649 A | * | 3/1988 | Nishizawa | 29/840 |
| 4,826,272 A | * | 5/1989 | Pimpinella et al. | 385/92 |
| 4,830,450 A | * | 5/1989 | Connell et al. | 385/78 |
| 4,989,934 A | * | 2/1991 | Zavracky et al. | 385/14 |
| 5,247,596 A | * | 9/1993 | Maignan et al. | 385/88 |
| 5,247,597 A | * | 9/1993 | Blacha et al. | 385/88 |
| 5,259,054 A | * | 11/1993 | Benzoni et al. | 385/89 |
| 5,345,529 A | * | 9/1994 | Sizer et al. | 385/147 |
| 5,428,704 A | * | 6/1995 | Lebby et al. | 385/92 |
| 5,434,939 A | * | 7/1995 | Matsuda | 385/88 |
| 5,515,467 A | * | 5/1996 | Webb | 385/88 |
| 5,692,083 A | * | 11/1997 | Bennett | 385/88 |
| 6,283,644 B1 | * | 9/2001 | Gilliland et al. | 385/93 |
| 6,527,455 B2 | * | 3/2003 | Jian | 385/88 |
| 6,623,178 B1 | * | 9/2003 | Sakurai et al. | 385/92 |
| 6,626,585 B1 | * | 9/2003 | Malone | 385/88 |
| 6,676,302 B2 | * | 1/2004 | Cheng et al. | 385/88 |
| 2001/0036344 A1 | * | 11/2001 | Steinberg et al. | 385/92 |
| 2002/0050561 A1 | * | 5/2002 | Heremans et al. | 250/227.11 |
| 2002/0102060 A1 | * | 8/2002 | Jewell et al. | 385/49 |
| 2003/0034438 A1 | * | 2/2003 | Sherrer et al. | 250/216 |

FOREIGN PATENT DOCUMENTS

JP 02297511 A * 12/1990 ............ G02B/6/42

* cited by examiner

*Primary Examiner*—Michelle R. Connelly-Cushwa
(74) *Attorney, Agent, or Firm*—Oliff & Berridge, PLC

(57) ABSTRACT

A method of manufacturing an optical module includes the steps of mounting an optical device onto a substrate with a surface on which an optical part is formed facing the substrate, and aligning an optical fiber with the optical part through the substrate. An aligning guide is provided at an end portion of the optical fiber except an end surface facing the optical part. The guide is attached to a guide receiving section, the position of which is determined relatively with the optical device.

22 Claims, 11 Drawing Sheets

OPTICAL MODULE AND METHOD OF MANUFACTURING THE SAME, AND OPTICAL TRANSMISSION DEVICE

Japanese Patent Application No. 49775/2001 filed on Feb. 26, 2001 is hereby incorporated in its entirety.

BACKGROUND OF THE INVENTION

The present invention relates to an optical module, method of manufacturing the same and optical transmission device.

In recent years, information communication has been in a tendency toward the increase in speed and capacity while the optical communication has been further developed. In optical communication, generally the electric signal is converted into an optical signal so that the optical signal is transmitted through the optical fiber to convert the received optical signal into an electric signal. The conversion between electric and optical signals is carried out by the use of an optical device. Meanwhile, there is known an optical module having an optical device mounted on a platform.

In the conventional optical module, there is a difficulty in alignment between the optical device and the optical fiber. For example, it is a conventional practice to align an optical fiber with utilizing a V-groove formed in the platform. However, the optical fiber is not easy to handle. Thus, there has been a difficulty in alignment with accuracy.

BRIEF SUMMARY OF THE INVENTION

A method of manufacturing an optical module according to a first aspect of the present invention comprises the steps of:

mounting an optical device on a substrate in a manner that a surface of the optical device on which an optical part is formed faces the substrate; and aligning an optical waveguide in a manner to face the optical part through the substrate, the optical waveguide being provided with an aligning guide at an end portion thereof except an end surface facing the optical part, wherein the aligning step further includes attaching the guide to a guide receiving section, a position of which is determined relatively with the optical device.

An optical module according to a second aspect of the present invention is manufactured by the above-described method of manufacturing an optical module.

An optical module according to a third aspect of the present invention comprises:

a substrate;

an optical device mounted on the substrate in a manner that a surface of the optical device on which an optical part is formed faces the substrate;

an optical waveguide aligned in a manner that an end surface thereof faces the optical part through the substrate;

an aligning guide provided at an end portion of the optical waveguide except the end surface facing the optical part; and a guide receiving section attached to the guide, a position of the guide receiving section being determined relatively with optical device and.

An optical transmission device according to a fourth aspect of the present invention comprises:

first and second substrates;

a light-emitting device mounted on the first substrate in a manner that a surface on which a light-emitting section is formed faces the first substrate;

a light-receiving device mounted on the second substrate in a manner that a surface on which a light-receiving section is formed faces the second substrate;

an optical waveguide aligned in a manner that one end surface faces the light-emitting section through the first substrate and the other end surface faces the light-receiving section through the second substrate;

an aligning guide provided at an end portion of the optical waveguide except one of the end surfaces; and a guide receiving section attached to the guide, a position of the guide receiving section being determined relatively with the light-emitting device or the light-receiving device.

DETAILED DESCRIPTION OF THE EMBODIMENT

Figure 1:
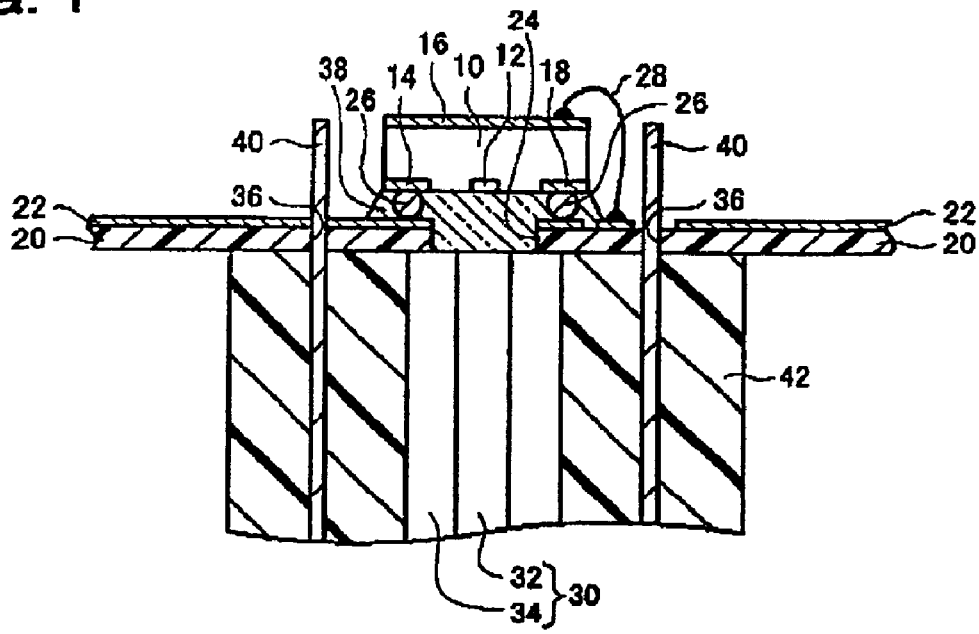
FIG. 1 shows an optical module according to a first embodiment to which the present invention is applied.

Embodiments of the present invention are to solve the problem in the conventional art, and may provide an optical module excellent in handling the optical fiber and high in positional accuracy and a method of manufacturing the same and optical transmission device.

(1) A method of manufacturing an optical module according to an embodiment of the present invention comprises the steps of:

mounting an optical device on a substrate in a manner that a surface of the optical device on which an optical part is formed faces the substrate; and aligning an optical waveguide in a manner to face the optical part through the substrate, the optical waveguide being provided with an aligning guide at an end portion thereof except an end surface facing the optical part, wherein the aligning step further includes attaching the guide to a guide receiving section, a position of which is determined relatively with the optical device.

According to this embodiment, the guide provided at an end portion of the optical waveguide is used to align the optical waveguide with the optical device. This provides excellence in handling the optical waveguide because the waveguide may be aligned by attaching the guide to the guide receiving section. Accordingly, the optical waveguide may be aligned with the optical device with positional accuracy.

(2) In this method of manufacturing an optical module, the guide may be a pin projecting beyond the end surface of the optical waveguide in an axial direction of the optical waveguide, the guide receiving section may be a hole formed in the substrate, and the pin may be inserted in the hole formed in the substrate.

Due to this, the optical waveguide is aligned by inserting the pin in the hole of the substrate. Because the pin projects axially of the optical waveguide, the optical waveguide may be determined to a position on a plane perpendicular to an axis thereof by inserting the pin in the hole of the substrate.

(3) In this method of manufacturing an optical module, the substrate may have a support member on a surface opposite to a surface on which the optical device is mounted, the guide may be provided in a manner to cover a periphery of the end portion of the optical waveguide, the guide receiving section may be a hole formed in the support member, and the guide may be placed in the hole formed in the support member.

Due to this, the optical waveguide is aligned by placing the guide provided in a manner to cover a periphery at an end portion of the optical waveguide in the hole of the support member. By merely placing the guide in the hole, the optical waveguide may be easily aligned.

(4) This method of manufacturing an optical module may further include providing a lens in the optical part at a side facing the optical waveguide prior to aligning the optical waveguide.

This makes it possible to coincide the light intensity distribution of the optical device with that of the optical waveguide.

(5) This method of manufacturing an optical module may further include mounting an electronic component on the substrate.

(6) in this method of manufacturing an optical module, the electronic component may be stacked on the optical device.

This makes it possible to effectively utilize the surface area of the substrate. Meanwhile, it is possible to shorten the length of wiring that electrically connects the electronic component to the optical device.

(7) An optical module according to an embodiment of the present invention is manufactured by the above-described method of manufacturing an optical module.

(8) An optical module according to an embodiment of the present invention comprises:

a substrate;

an optical device mounted on the substrate in a manner that a surface of the optical device on which an optical part is formed faces the substrate;

an optical waveguide aligned in a manner that an end surface thereof faces the optical part through the substrate;

an aligning guide provided at an end portion of the optical waveguide except the end surface facing the optical part; and a guide receiving section attached to the guide, a position of the guide receiving section being determined relatively with optical device.

According to the embodiment, the guide provided at an end portion of the optical waveguide is used to align the optical waveguide with the optical device. This provides excellence in handling the optical waveguide because the waveguide may be aligned by attaching the guide to the guide receiving section. Meanwhile, because the optical device is mounted on the substrate, the distance may be decreased between the end surface of the optical waveguide and the optical part. Accordingly, it is possible to provide an optical module in which the optical waveguide is aligned with the optical device with positional accuracy.

(9) In this optical module, the guide ay be a pin projecting beyond the end surface of the optical waveguide in an axial direction of the optical waveguide, the guide receiving section may be a hole formed in the substrate, and the pin may be inserted in the hole formed in the substrate.

Due to this, the relative position between the optical device and the optical waveguide may be determined by the pin.

(10) This optical module may further comprise a support member provided on the substrate, Due to this, mechanical strength of the substrate may be increased, for example.

(11) This optical module may further include a support member provided on a surface of the substrate opposite to a surface on which the optical device is mounted, and the guide receiving section may be a hole formed in the support member, and the guide may be provided in a manner to cover a periphery of the end portion of the optical waveguide and placed in the hole formed in the support member.

Due to this, by placing the guide in the hole of the support member, the relative position between the optical device and the optical waveguide may be determined.

(12) In this optical module, the support member may be formed of a material that has less thermal expansion than the substrate.

Due to this, expansion or shrinkage of the substrate due to temperature change may be reduced. Accordingly, the optical waveguide is accurately aligned with the optical device mounted on the substrate.

(13) This optical module may further include a lens provided between the optical part and the optical waveguide.

Due to this, light intensity distribution may be made coincident at between the optical device and the optical waveguide.

(14) In this optical module, the support member may be provided at least between the optical part and the optical waveguide, and may have a lens above the optical part.

Due to this, it is possible to reduce the number of parts and hence the cost.

(15) This optical nodule may further include an electronic component mounted on the substrate.

(16) In this optical module, the electronic component may be stacked on the optical device.

Due to this, it is possible to effectively use the surface area of the substrate. Meanwhile, it is possible to shorten the length of wiring that electrically connects the electronic component to the optical device.

(17) An optical transmission device according to an embodiment of the present invention comprises:

first and second substrates;

a light-emitting device mounted on the first substrate in a manner that a surface on which a light-emitting section is formed faces the first substrate;

a light-receiving device mounted on the second substrate in a manner that a surface on which a light-receiving section is formed faces the second substrate;

an optical waveguide aligned in a manner that one end surface faces the light-emitting section through the first substrate and the other end surface faces the light-receiving section through the second substrate;

an aligning guide provided at an end portion of the optical waveguide except one of the end surfaces; and a guide receiving, section attached to the guide, a position of the guide receiving section being determined relatively with the light-emitting device or the light-receiving device.

According to the embodiment, the guide provided at an end portion of the optical waveguide is used to align the optical waveguide with the light-emitting device or light-receiving device. This provides excellence in handling the optical waveguide because the waveguide may be aligned by attaching the guide to the guide receiving section. Meanwhile, because the light-emitting device or light-receiving device is mounted on the substrate, the distance between the end surface of the optical waveguide and the light-emitting section or light-receiving section may be decreased. Accordingly, it is possible to provide an optical transmission device in which the optical waveguide is aligned with positional accuracy.

(18) This optical transmission device may further include a plug to be connected to the light-receiving device; and a plug to be connected to the light-emitting device.

With reference to the drawings, explanation will be now made on embodiments of the present invention. Note that the present invention is not limited to the embodiments described below.

First Embodiment

Figure 2:
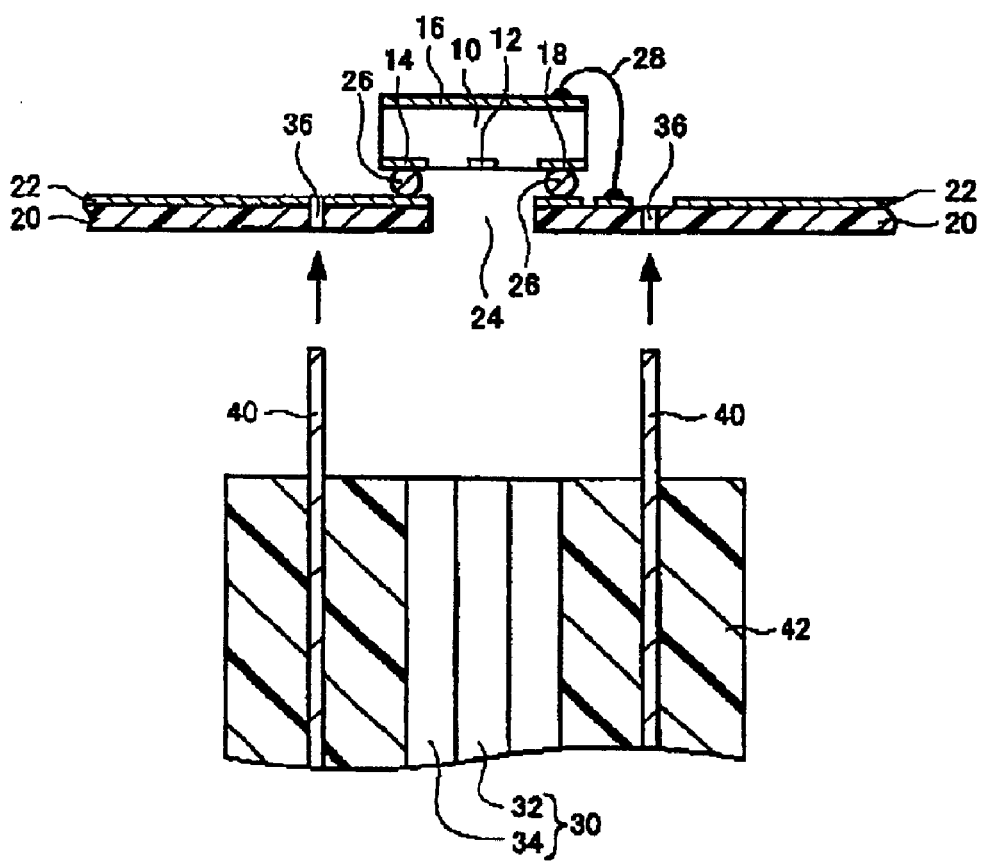
FIG. 2 shows a method of manufacturing an optical module according to the first embodiment to which the present invention is applied.

FIGS. 1 and 2 show an optical module according to a first embodiment to which the present invention is applied and a method of manufacturing the same. The optical module includes an optical device 10, a substrate 20 and an optical fiber 30. The optical fiber 30 has a guide at an end portion thereof. In this embodiment, the guide is a pin 40. Note that the optical fiber 30 is an example of an optical waveguide.

The optical device 10 may be a light-emitting or light-receiving device. The light-emitting device is to be applied, as an example, by a surface-emitting device, particularly a surface-emitting laser. The surface-emitting device, such as a surface-emitting laser, emits light in a direction perpendicular to the substrate. The optical device 10 has an optical part 12. When the optical device 10 is a light-emitting device, the optical part 12 is a light emitting part while, when the optical device 10 is a light-receiving device, the optical part 12 is a light-receiving section.

The optical device 10 is in a state fixed in relative position to the optical fiber 30. Specifically, the optical part 12 of the optical device 10 and the optical fiber 30 at its tip surface may be fixed in their relative positions. In concrete, the optical part 12 is in a state facing the tip surface of the optical fiber 30.

The optical device 10 has at least one (generally two or more) electrodes. For example, a first electrode 14 may be provided on a surface forming the optical part 12. On the optical device 10, a dummy electrode 18 may be formed on a surface forming the first electrode 14. The dummy electrode 10, although formed of the same material as the first electrode 14, is not electrically connected to an interior of the optical device 10. By forming a dummy electrode 18 in the same thickness as the first electrode 14, a plurality of joining surfaces are formed to the same height and, accordingly, the optical device 10 may be stably supported. Particularly, the first electrode 14 or dummy electrode 18 may be arranged in a manner depicting a polygon when connected with line segments. By doing so, the optical device 10 may be stably held at three or more points.

A second electrode 16 may be provided on a surface separate to the surface the first electrode 14 is provided. When the optical device 10 is a semiconductor laser such as a surface-emitting laser, a second electrode 16 may be provided on a surface opposite to the surface the first electrode 14 is provided.

The optical device 10 is mounted on the substrate 20. The substrate 20 may be formed of resin, e.g. a flexible board made of a material such as polyimide resin. The substrate 20 may be a tape in a thin film form. The substrate 20, although not shown, may have a plurality of surfaces in a three-dimensional fashion. Specifically, the substrate 20 may be bent to have a plurality of surfaces. In such a case, the optical device 10 is mounted on any of the surfaces. Note that the substrate 20 may be of insulator, conductor or semiconductor other than resin. The thickness of the substrate 20, although not limited, may approximately 25 $\mu$m to 5 mm, for example.

The substrate 20 is formed with a conductive layer 22. The conductive layer 22, electrically connected to the optical device 10, may be in an interconnect pattern as required. The conductive layer 22 can be formed by sputtering, etching or plating process.

The substrate 20 has an aperture 24 formed in a region including the region corresponding to the optical part 12 of the optical device 10. The aperture 24 is formed through the substrate 20. The optical device 10 is mounted on the substrate 20, with the optical part 12 facing the aperture 24. The aperture 24 allows the transmission of light between the optical part 12 of the optical device 10 and the end surface of the optical fiber 30.

In the substrate 20, holes 36 are formed in the regions on an outer side of the optical part 12 of the optical device 10. The holes 36 are guide receiving sections to be inserted on the positioning guides (pins 40). The holes 36 may be formed in plurality. The hole 36 has a diameter in a size to fix the guide (pin 40) inserted therein.

The optical device 10 may have at least one bump 26 in order for electrical connection to the outside. For example, a bump 26 may be provided on the surface forming the optical part 12 to provide electrical connection between the optical device 20 and the outside. For example, the bump 26 may be provided on the first electrode 14 and dummy electrode 18. The bump 26 may project or not project with respect to the optical part 12. The bump 26, if formed high, may prevent the end surface of the optical fiber 30 from contacting with the optical part 12 even if the substrate 20 is extremely small in thickness. The bump 26 may be formed by a conductive ball of gold or solder.

Note that the electrical connection between the optical device 10 and the conductive layer 22 may be made by the use of a wire 28 or conductive paste, other than the bump 26. For example, electrical connection between the second electrode 18 of the optical device 10 facing the surface opposite to the substrate 20 and the conductive layer 22 may be made by a wire 28.

The optical fiber 30 includes a core 32 and a clad 34 coaxially surrounding it. Light is reflected at the boundary on the core 32 and clad 34 and confined within and propagated through the core 32. The optical fiber 30 may be formed of a material of glass, plastic or the like. Meanwhile, the core 32 and the clad 34 may use different materials. Note that the clad 34, in many cases, is protected by a jacket at its periphery excepting particularly its end.

The end surface of the optical fiber 30 (end surface of the core 32 and clad 34) is directed to the optical part 12 of the optical device 10. Guides (pins 40) are provided at the end portion of the optical fiber 30 except the end surface. The guides (pins 40) are used in aligning the optical fiber 30 with the optical part 12 of the optical device 10. By the guides (pins 40), one optical fiber 30 may be aligned or a plurality of optical fibers 30 may be aligned at the same time.

As shown in FIG. 1, the pin 40 axially projects with respect to the end surface of the optical fiber 30. The pins 40 fix a relative position of the optical device 10 and optical fiber 30. The pins 40 (guides) are inserted in the holes 36 (guide receiving sections) provided in the substrate 20. Specifically, the pin 40 penetrates the substrate 20 through the hole 36. One pin 40 may be inserted in one hole 36. The pin 40 may be provided two or more for one or a plurality of optical fibers 30 to be simultaneously aligned. This makes it possible to fix the optical fiber 30 to a position on a plane perpendicular to the axis thereof.

A fixing part 42 is provided at the end portion of the optical fiber 30 to fix the pins 40 on the optical fiber 30. The fixing part 42 may be provided in a position avoiding the end surface of the optical fiber 30 to surround the periphery of the end portion thereof. The fixing part 42 may be provided one on one optical fiber 30, or one on a plurality of optical fibers 30. In the case that it is provided on a plurality of optical fibers 30, the optical fibers 30 may be arranged side by side in a manner that the end surfaces thereof are place on the same plane and the axial directions thereof area parallel to one another. In such a case, the pins 40 may be provided on the both outer sides of the plurality of optical fibers 30. The fixing part 42 may be formed of ceramic or the like. The fixing part 42 may be referred to as a ferrule. Meanwhile, a member may be provided to cover the periphery at the end portions of the optical fibers 30 to bundle the optical fibers 30 in one fixing part 42.

Note that, although the example shown in FIG. 1 showed the pins 40 as guides, the present embodiment is not limited to that. For example, as a positioning guide, it is possible to use a portion of the optical fiber 30 that axially projects from the surface of the fixing part 42 on a side of the end surface of the optical fiber 30. Namely, the guide may be constituted as a part of the fixing part 42. In such a case, the hole 36 as a guide receiving section in the substrate 20 is structured in a form to attach the guide.

A light-transmissive resin 38 may be provided adhered to both of the optical part 12 of optical device 10 and the end surface of optical fiber 30. The light-transmissive resin 38 is to transmit the light for use in the optical device 10. Namely, the light-transmissive resin 38 transmits emission light where the optical device 10 is a light-emitting device. It transmits incident light where the optical device 10 is a light-receiving device. Due to the light-transmissive resin 38, no air exists between the optical part 12 and the optical fiber 30 thus reducing light-transmission loss. The refractive index of the light-transmissive resin 38 maybe nearly equal to the refractive index of the core 32 of the optical fiber 30. Note that the light-transmissive resin 38, if provided to cover a mount region of the optical device 10 on the substrate 20, can be used as an under-fill material.

According to the optical module in this embodiment, the guides (pins 40) provided at the end portion of the optical waveguide (optical fiber 30) are used to align the optical waveguide with the optical device 10. Due to this, the guide is attached to the guide receiving section (hole 36 in the substrate 20) to align the optical waveguide, thus providing excellence in handling the optical waveguide. Meanwhile, because the optical device 10 is mounted on the substrate 20, the distance can be decreased between the end portion of optical waveguide and the optical part 12. Accordingly, an optical module in which the optical waveguide is aligned with the optical device 10 with positional accuracy can be provided.

The optical module according to the embodiment is structured as above. Explanation will be made below on a method of manufacturing the same.

First, prepared are an optical device 10 and a substrate 20. The optical device 10 is mounted on the substrate 20, with the surface having the optical part 12, first electrode 14 and dummy electrode 18 faced thereto. In such a case, the optical part 12 is directed toward the aperture 24 formed in the substrate 20. Namely, the optical part 12 is exposed to the opposite surface of the substrate 20.

The electrodes of the optical device 10 are electrically connected to the conductive layer 22 of the substrate 20. The connecting means may use bumps 26, wires 28 or a conductive paste containing anisotropic conductive material. In such a case, the optical device 10 is heated up and mounted on the substrate 20.

Next, the optical fiber 30 is aligned with and attached to the optical part 12. The optical fiber 30 is provided with a guide at its end. In the example shown in FIG. 2, the guide is a pin 40. The pin 40 projects axially of the optical fiber 30 with respect to the end surface of the optical fiber 30. Meanwhile, the pin 40 is connected to the fixing part 42 provided on a peripheral surface at the end portion of the optical fiber 30. Then, the optical fiber 30 is aligned with the optical part 12 exposed by the aperture 24 by the pins 40, at the opposite side of the substrate 20 to the surface mounting the optical device 10.

In the example shown in FIG. 2, the pins 40 provided at the end portion of the optical fiber 30 are inserted, respectively, to the holes 36 (guide receiving sections) of the substrate 20. Specifically, the respective pins 40 are inserted in the holes 36 in such a position that the core 32 of optical fiber 30 and the optical part 12 are coincident in their axes. Because the pins 40 project axially of the optical fiber 30, the optical fiber 30 may be fixed to a position on a plane perpendicular to the axis thereof by inserting the pins 40 in the holes 36.

The optical fiber 30 may be axially aligned by placing the peripheral surface of the fixing part 42 at around the end surface of the optical fiber 30 into contact with the substrate 20. Because the substrate 20 is formed with the aperture 24 in the region including the optical part 12, an optical path is secured between the optical part 12 and the optical fiber 30. Meanwhile, even if the substrate 20 is formed by a polyimide tape or the like in an extremely small thickness, the provision of bumps 26 between the optical device 10 and the substrate 20 may prevent the optical fiber 30 from contacting the optical part 12.

After fixing the optical fiber 30, a light-transmissive resin 38 if required may be provided between the optical part 12 of optical device 10 and the end surface of optical fiber 30. The light-transmissive resin 38 may be provided to cover the surface of optical device 10 facing the substrate 20. The light-transmissive resin 3B may be provided adhering to the end surface of optical fiber 30, to adhesively fix the position of optical fiber 30.

Otherwise, the light-transmissive resin 38 may be provided prior to alignment of the optical fiber 30. In such a case, the light-transmissive resin 38 may be provided prior to mounting the optical device 10 onto the substrate 20 or after mounting the same.

Before aligning the optical fiber 30, the end surface to be positioned facing toward the optical part 12 may be polished. This process is carried out in a state the fixing part 42 is placed on the optical fiber 30. Specifically, by polishing the surface of fixing part 42 to be placed facing toward the optical part 12, the end surface of optical fiber 30 is placed flush with the end surface of fixing part 42. Due to this, polishing the end surface of fixing part 42 polishes the end surface of optical fiber 30, making the process easy to perform In the later process, the fixing part 42 of optical fiber 30 is used, as it is, to carry out alignment with the pins 40.

According to the optical module manufacturing method of this embodiment, the guides (pins 40) provided at the end portion of optical waveguide (optical fiber 30) is used to align the optical waveguide with the optical device 10. Due to this, the optical waveguide can be aligned by fixing the guides in the guide receiving sections (holes 36 in the substrate 20). This, accordingly, provides excellence in handling the optical waveguide. Accordingly, it is possible to accurately align the optical waveguide relative to the optical device 10.

Second Embodiment

Figure 3:
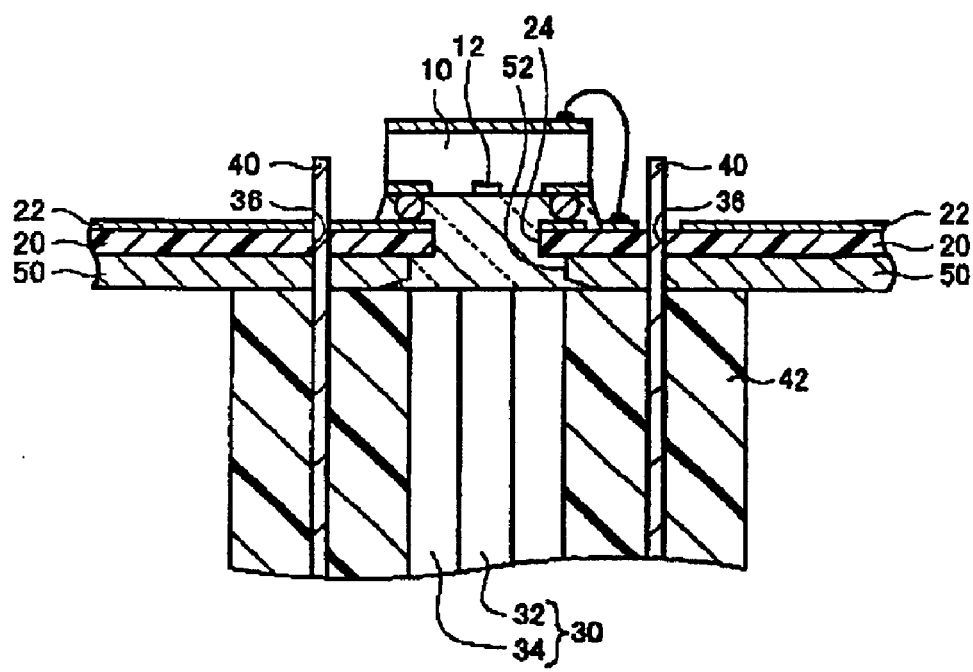
FIG. 3 shows an optical module according to a second embodiment to which the present invention is applied.

FIG. 3 shows an optical module according to a second embodiment to which the invention is applied. For the example shown below, the explanation to be made in other embodiments is applicable to a possible extent. Note that the duplicated explanations with respect to the foregoing embodiment are omitted in this embodiment.

This optical module further includes a support member 50 provided on the substrate 20. The support member 50 is provided on the surface of substrate 20 opposite to the surface mounting the optical device 10. The support member 50 is provided in a part or the entire of the substrate 20. The shape may be nearly in an equal form to the planar shape of the substrate 20. The support member 50 may be formed with an aperture 52 communicating with the aperture 24 of the substrate 20. Namely, an optical path is secured between the end surface of optical module 30 and the optical part 12 by the aperture 24 of substrate 20 and the aperture 52 of support member 50.

The support member 50 may mechanically reinforce the substrate 20. The support member 50 may be formed of a material that has less thermal expansion than the substrate 20. Due to this, even where polyimide resin is provided as a material of the substrate 20, the support member 50 may suppress the substrate 20 from expanding or shrinking due to temperature change. Consequently, even where heat is applied in mounting the optical device 10, the substrate 20 may be prevented from expanding. Accordingly, it is possible to prevent the pin-inserting hole 36 formed in the substrate 20 from deviating in position, and hence accurately align the optical fiber 30.

The support member 50 may be formed of a metal of SUS, copper or aluminum, or a plastic or the like. Meanwhile, the thickness of the support member 50 is not limited but may be, e.g. 20 $\mu$m to 5 mm.

Meanwhile, the support member 50 may be used as a shield to cut off electromagnetic waves. Otherwise, in the case of formed by a conductive member, the support member 50 can be used as a ground by being connected to the conductive layer 22.

According to the optical module of this embodiment, because the support member 50 is provided on the substrate 20, the substrate 20 is suppressed from expanding or shrinking thus accurately aligning the optical fiber 30. Meanwhile, the support member 50 may improve the mechanical strength of the substrate 20. Furthermore, the substrate 20 may be utilized as a shield or ground. Accordingly, it is possible to provide a reliable optical module.

Note that the content shown in the foregoing embodiment can be applied to the optical-module manufacturing method of this embodiment, except the provision of the support member 50 on the substrate 20.

Third Embodiment

Figure 4:
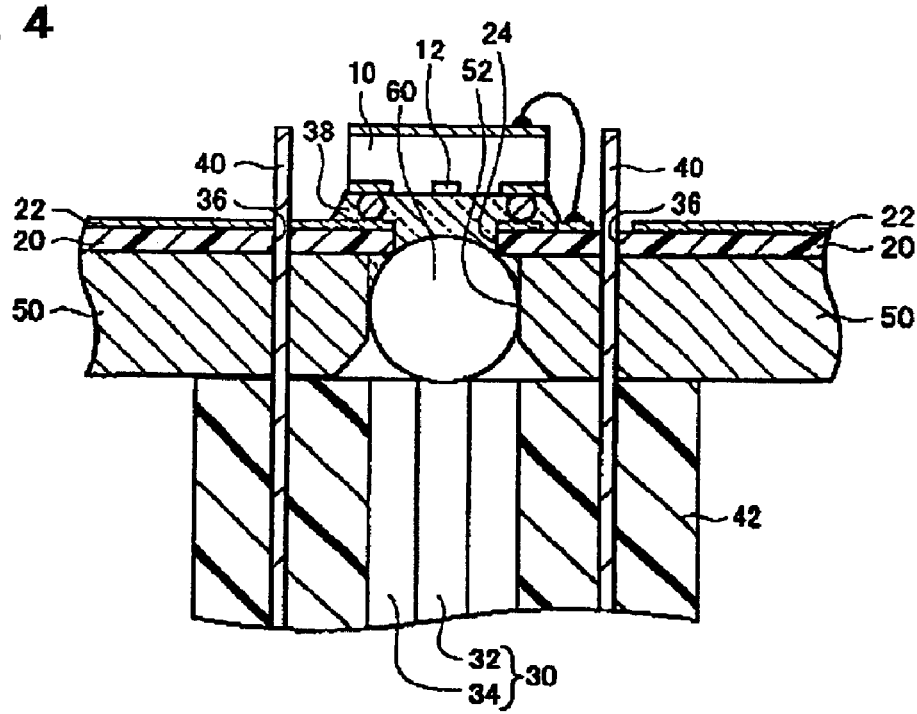
FIG. 4 shows an optical module according to a third embodiment to which the present invention is applied.

FIG. 4 shows an optical module according to a third embodiment to which the invention is applied. For the example shown below, the explanation to be made in other embodiments is, applicable to a possible extent.

This optical module further includes a lens 60. The lens 60 is provided between the optical part 12 of optical device 10 and the end surface of optical fiber 30. The lens 60 may be adhered to the optical device 10 and substrate 20 by light-transmissive resin 38.

The lens 60 is used to make the light-intensity distribution equal between the optical part 12 and the core 32 of optical fiber 30. In particular, in the case a plastic fiber is used as an optical fiber 30, the lens 60 may be provided on a side close to the light-receiving device because of large diameter of the core 32.

Where a support member 50 is provided on the substrate 20, the lens 60 may be placed in an aperture 52 of the support member 50. For example, where the lens 60 is spherical, an aperture 52 having a length, width and depth nearly equal to the diameter of the lens 60 may be formed in the support member 50 as shown in FIG. 4 to place the lens 60 in the aperture 52. This may fix a position of the lens 60 relative to the optical part 12 without requiring to re-align it.

Meanwhile, where for example two or more of optical devices 10 are mounted side by side in one array on the substrate 20, the aperture 52 may be formed elongate so that two or more of lenses 60 are placed in an array in the elongate aperture 52. In such a case, a diameter of each lens 60 may be nearly equal to a pitch of the optical parts 12. Due to this, by merely placing the lenses 60 in the elongate aperture 52 formed in the support member 50, the lenses 60 may be easily positioned between the optical devices 10 and the optical fiber 30. Note that, where two or more lenses 60 are placed in the aperture 52, the aperture 52 is not required in an elongate form but may be in a form conforming to an arrangement of the optical parts 12.

Figure 5:
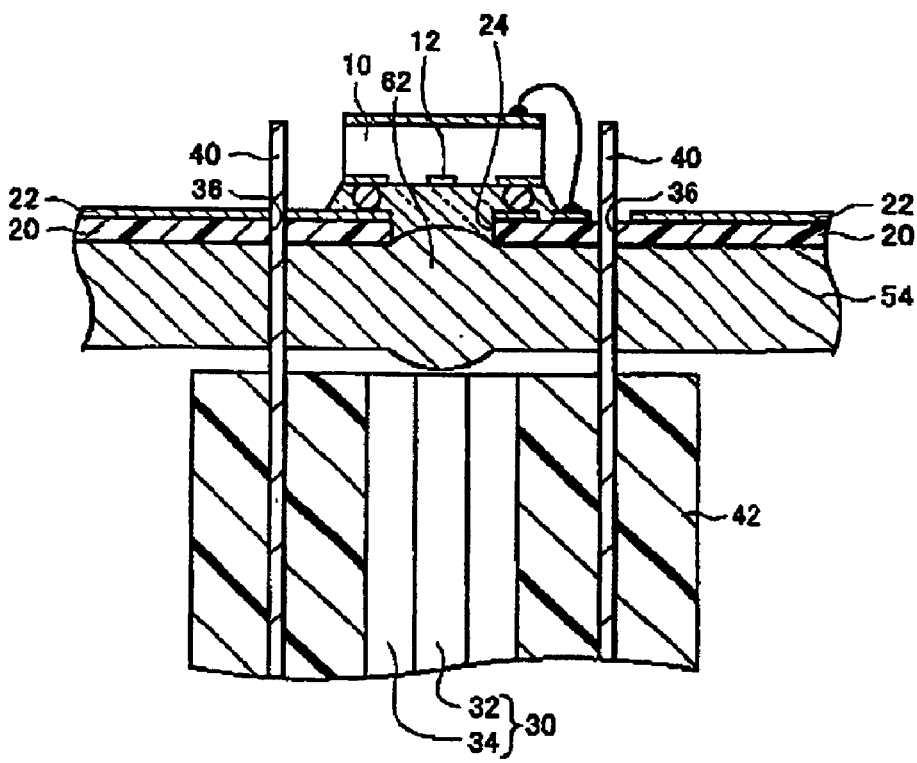
FIG. 5 shows an optical module according to a modification to the third embodiment to which the present invention is applied.

FIG. 5 shows an optical module according to a modification to the third embodiment. In this modification, the support member 54 is provided at least between the optical part 12 and the optical fiber 30, to have a lens 62 above the optical part 12. Namely, the lens 62 may be previously fixed in the support member 54. This may reduce the number of parts and hence the cost.

The content shown in the foregoing embodiment is applicable to the optical-module manufacturing method of this embodiment, except that the lens 60 is provided above the optical part 12 prior to aligning the optical fiber 30.

The content shown in the foregoing embodiment is applicable to the optical-module manufacturing method of the modification shown in FIG. 5, except that a support member 54 having a lens 62 is provided on the substrate 20.

Fourth Embodiment

FIG. 6 to FIG. 10C are figures shoving an optical module according a fourth embodiment to which the invention is applied, and a method of manufacturing the same. For the example shown below, the explanation to be made in other embodiments is applicable to a possible extent.

Figure 6:
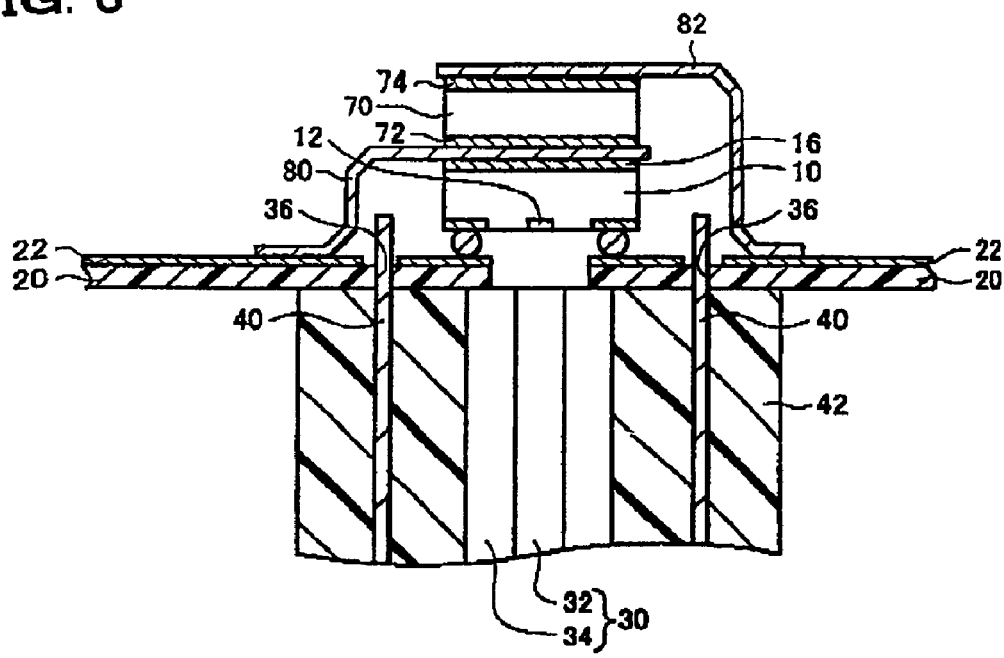
FIG. 6 shows an optical module according to a fourth embodiment to which the present invention is applied.

As shown in FIG. 6, this optical module further includes an electronic component 70. The electronic component 70 is electrically connected to the conductive layer 22 and mounted on the substrate 20. The electronic component 70 may use a resistor, a capacitor, a coil, a transmitter, a filter a temperature sensor, a thermistor, a varistor, a volume, a fuse, a heat sink, a Peltier device or a heat pipe. The electronic component 70 may be a surface-mounting type to be electrically connected with the conductive layer 22 by solder or the like with the surface forming the electrode directed toward the substrate 20. Otherwise, it may be an insertion-mounting type having electrode pins to be inserted in through-holes formed in the substrate 20.

The electronic component 70 may be stacked on the optical device 10. In such a case, the electronic component 70 is surface-mounted on the optical device 10. Specifically, an electrode 72 of the electronic component 70 is arranged to face the second electrode 16 of optical device 10. In the electrical connection between the both, may be used a bump, a wire or a conductive paste. The surface area of the substrate 20 may be effectively used by stacking the electronic component 70 on the optical device 10. This, accordingly, reduces the surface area of the substrate 20 thus providing a dense, small-sized optical module.

For example, the electronic component 70 shown in FIG. 6 may be a capacitor. In the case that a capacitor is stacked on the optical device 10, the capacitor used may be a vertical type. This allows the capacitor to be stably mounted on the optical device 10.

In the example shown in FIG. 6, the optical device 10 and the capacitor are electrically connected together through a conductive tape 80 (e.g. conductive foil). Specifically, one end of the conductive tape 80 is sandwiched between the second electrode 16 of optical device 10 formed in the surface opposite to the optical part 12 and an electrode 72 of capacitor. The other end of conductive tape 80 is electrically connected to the conductive layer 22 of substrate 20. The conductive tape 80 may be connected to the conductive layer 22 at its power-source side. Meanwhile, an electrode 74 is formed on the surface of the capacitor opposite to the optical device 10. The conductive tape 82 may be electrically connected to the electrode 74. The conductive tape 82 is electrically connected to the conductive layer 22 of substrate 20. The conductive tape 82 may be connected to the conductive layer 22 at its ground side.

Figure 7:
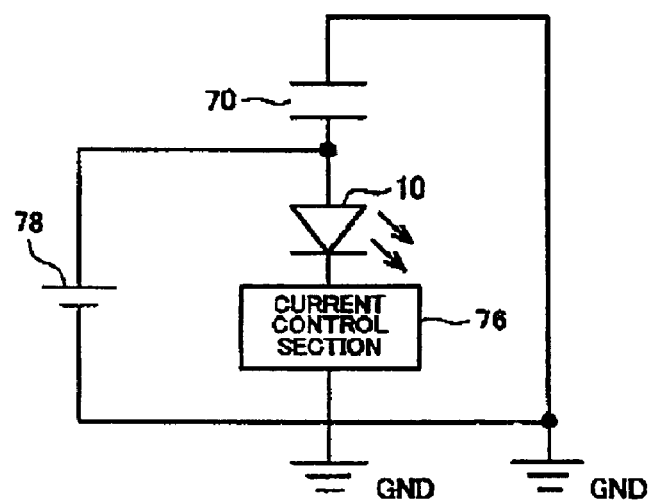
FIG. 7 is a circuit diagram explaining the optical module according to the fourth embodiment to which the present invention is applied.

FIG. 7 is a diagram showing an equivalent circuit of the optical module shown in FIG. 6. Specifically, this is an equivalent circuit for the case where the optical device 10 uses a light-emitting device. According to the circuit configuration, the noise caused by the change of current in a current control section 76 is propagated into the capacitor (electronic component 70) thereby making possible to reduce the propagation to a power source 78. This is prominent where the capacitor is provided close to the second electrode 16 of the optical device 10 connected to the power source 78. This can prevent the variation of voltage value in the power source 78 due to noise. Consequently, because a constant value of voltage can be applied to the optical device 10, it is possible to eliminate the malfunction in the optical device 10 and hence provide a reliable optical module. Note that the effect of this embodiment is true for the case the optical device 10 is a light-receiving device.

The content explained in the first embodiment is applicable to other embodiments, wherein the optical module 30 is fixed in relative position to the optical device 10 by the pins 40.

Figure 8A:
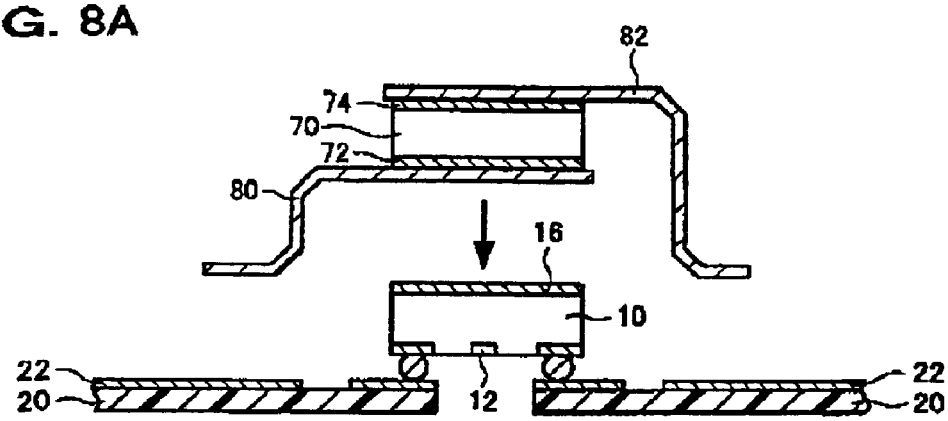
FIGS. 8A and 8B show an optical module according to the fourth embodiment to which the present invention is applied and a method of manufacturing the same.
Figure 8B:
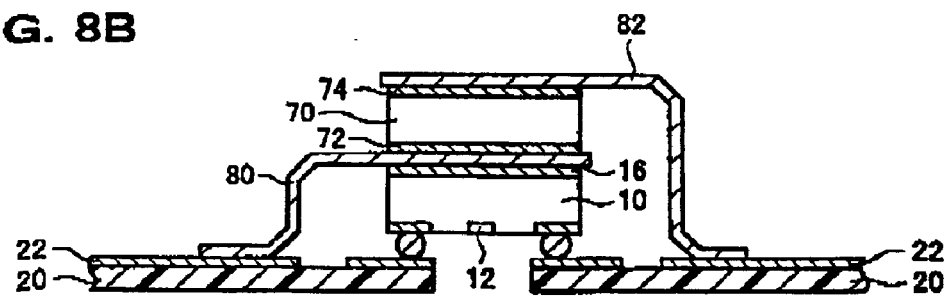

FIGS. 8A and 8B show a manufacturing method for an optical module in the present embodiment. As shown in FIG. 8A, after mounting the optical device 10 on the substrate 20, an electronic component 70 (capacitor in the shown example) is stacked on the optical device 10. The electronic component 70 is previously provided with conductive tapes 80 and 82 for electrical connection to the electrodes 72 and 74. The connection between the both may be made by melting and hardening a conductive adhesive or the like. As shown in FIG. 8B, the electronic component 70 is mounted on the optical device 10, and then the both are electrically connected through the conductive tape 80. Nearly at the same time, the conductive tapes 80 and 82 are electrically connected to the conductive layer 22 of substrate 20.

These processes may be carried out prior to aligning the optical fiber 30 to the optical device 10 or after the alignment thereof. In FIGS. 8A and 8B, the holes 36 (see FIG. 6) as guide receiving section for insertion of the pins 40 are omitted. Note that the manufacturing method shown is a mere example, e.g. a conductive tape 80 may be first provided on the optical device 10 and then the electronic component 70 and another conductive tape 82 be provided.

First Modification

Figure 9A:
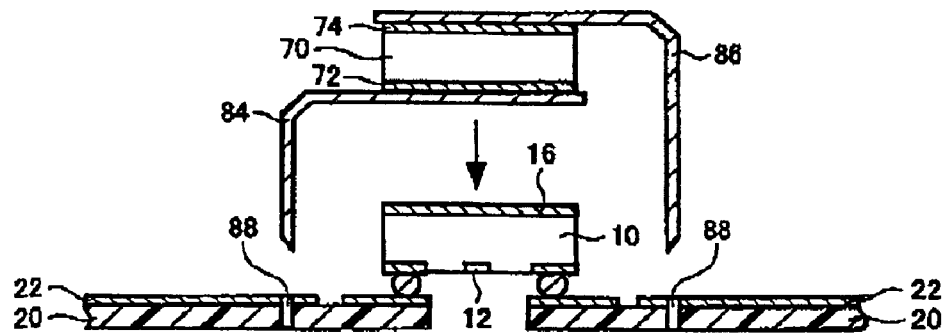
FIGS. 9A and 9B show an optical module according to a first modification to the fourth embodiment to which the present invention is applied and a method of manufacturing the same.
Figure 9B:
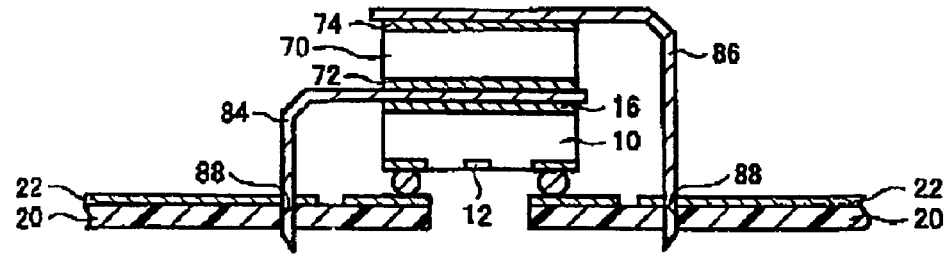

FIGS. 9A and 9B show a first modification to the present embodiment. This modification uses conductive frames 84 and 86 in place of the foregoing conductive tapes 80 and 82. The conductive frames 84 and 86, which may be a metal lead, are inserted in the hole 88 formed in the substrate 20 and electrically connected to the conductive layer 22. The electronic component 70 and the conductive frames 84 and 86 may be electrically connected together by a conductive paste (e.g. silver paste) or the like. For other forms, the foregoing content may be applied.

Second Modification

Figure 10A:
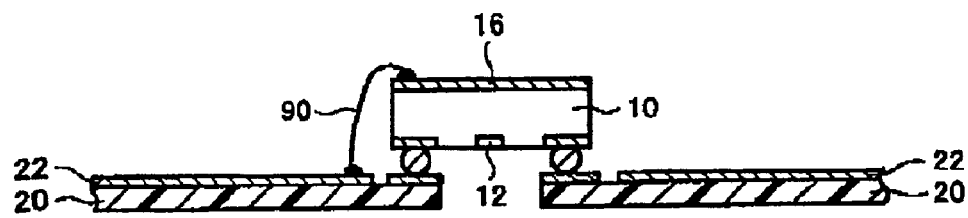
FIGS. 10A to 10C show an optical module according to a second modification to the fourth embodiment to which the present invention is applied and a method of manufacturing the same.
Figure 10B:
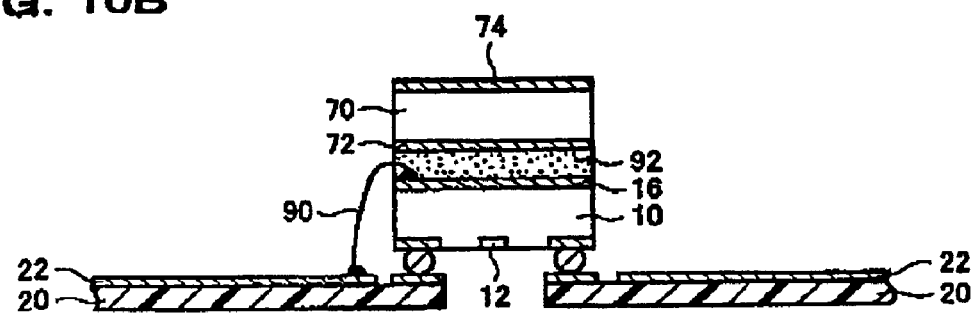
Figure 10C:
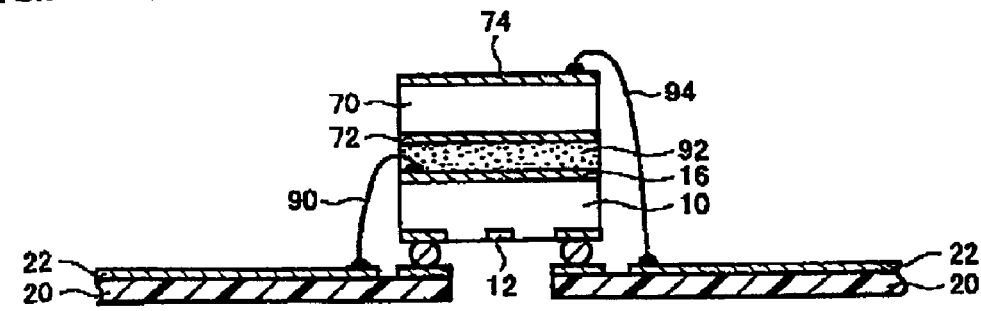

FIGS. 10A to 10C show a second modification to the present embodiment. In this modification, the electronic component 70 and optical device 10 are electrically connected to the conductive layer 22 of the substrate 20 by a wire 90 and 94. The wire 90 and 94 may be bonded by a wire-bonder for use in manufacturing semiconductor devices. In such a case, bonding is carried out by at least one of heat, pressure and ultrasonic-wave vibration. The wire 90 and 94 may be formed of gold or aluminum.

At first, as shown in FIG. 10A, the optical device 10 is mounted on the substrate 20. Thereafter, electrical connection is made through a wire 90 between the second electrode 16 formed in the surface of the optical device 10 opposite to the optical part 12 thereof and the conductive layer 22 of substrate 20. For wire-bonding, a bonding pad may be previously provided on the second electrode 16 or conductive layer 22. This facilitates wire-bonding.

Next, as shown in FIG. 10B, the electronic component 70 is stacked on the optical device 10. Although the electronic component 70 may be mounted on the optical device 10 in a position avoiding a region the wire 90 is bonded, it may be mounted in a manner covering the region of the wire 90 as shown in the figure. In such a case, a conductive paste 92 (e.g. silver paste) may be provided on the optical device 10 in order not to disconnect the wire 90.

Thereafter, as shown in FIG. 10C, electric connection is made through a wire 94 between the other electrode 74 of electronic component 70 and the conductive layer 22 of substrate 20. The form of wire-bonding is as per the above description.

Note that, when mounting a plurality of electronic components on the substrate 20, the conductive tape, conductive frame, wire and the like so far described may be combined to electrically connect the electronic components to the conductive layer 22 of substrate 20.

Fifth Embodiment

Figure 11:
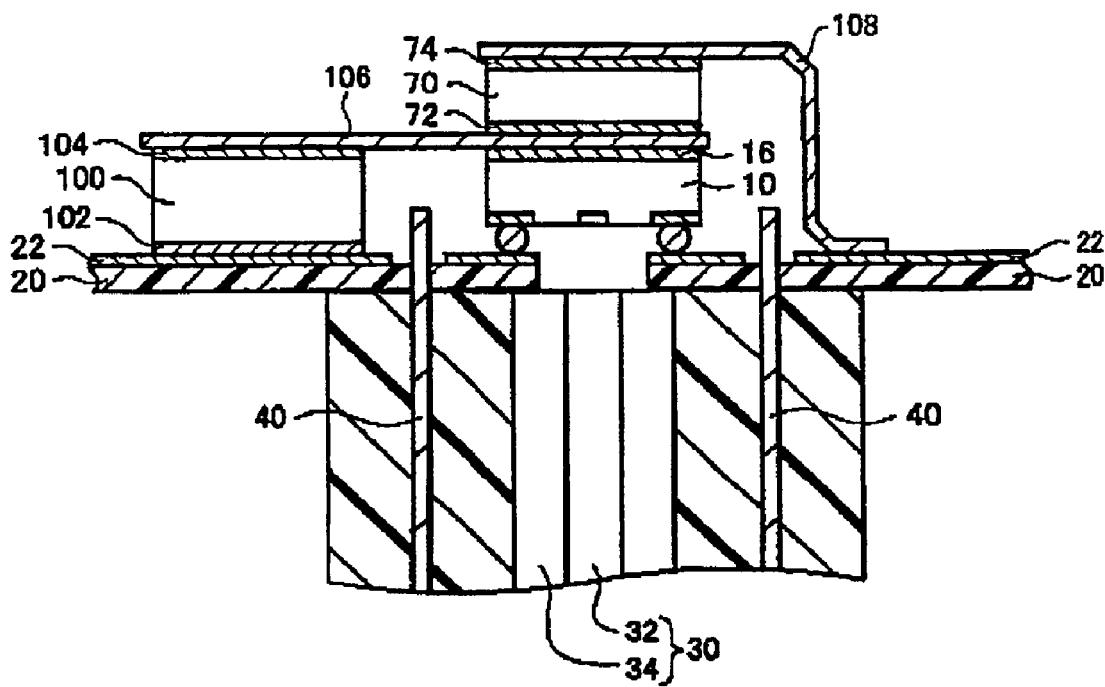
FIG. 11 shows an optical module according to a fifth embodiment to which the present invention is applied.
Figure 12:
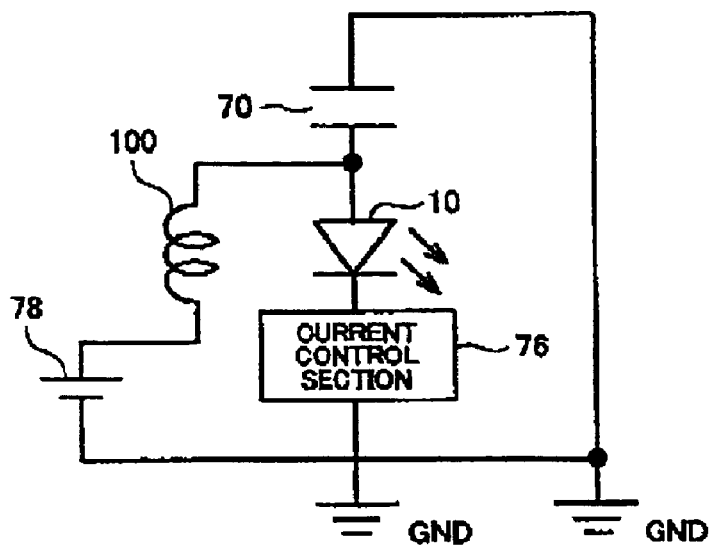
FIG. 12 is a circuit diagram explaining the optical module according to the fifth embodiment to which the present invention is applied.

FIGS. 11 and 12 are figures showing an optical module and its equivalent circuit according to a fifth embodiment to which the invention is applied. For the example shown below, the explanation to be made in other embodiments is applicable to a possible extent.

As shown in FIG. 11, this optical module has a plurality of electronic components 70 and 100. The electronic component 100 may use the similar one to that explained in the electronic component 70. In the example of FIG. 11, the electronic component 70 is a capacitor and the electronic component 100 is a coil.

The capacitor (electronic component 70) is stacked on the optical device 10, as shown in the foregoing embodiment. The both electrodes 72 and 74 of capacitor are electrically connected to the conductive layer 22 of substrate 20 respectively through conductive tapes 106 and 108. On the other hand, the coil (electronic component 100) is provided between the other end of conductive tape 106 having one end sandwiched between the capacitor and the optical device 10 and the conductive layer 22 of substrate 20. Specifically, the electrode 102 of coil is electrically connected with the conductive layer 22 of substrate 20 while the electrode 104 on the surface opposite to the electrode 102 is electrically connected to the conductive tape 106. In this optical module, a power voltage is applied from the conductive layer 22 of the substrate 20 to the optical device 10 through the coil.

FIG. 12 is a diagram showing an equivalent circuit of the optical module shown in FIG. 11. This, specifically, is an equivalent circuit for the case the optical device 10 uses a light-emitting device. According to this circuit configuration, the noise caused by the change of current in a current control section 76 is cut off by the coil thereby being prevented from propagating to a power source 78. Meanwhile, as shown in the figure, by connecting the current control section 76 and the power source 78 to separate grounds, it is possible to prevent the noise caused by the reflection from the ground due to the change of current in the current control section 76 from propagating to the power source 78. Accordingly, because voltage can be applied at a constant value to the optical device 10, it is possible to eliminate malfunction in the optical device 10 and hence provide a reliable optical module. Note that the effect of this embodiment is true for the case the optical device 10 is a light-receiving device.

Sixth Embodiment

Figure 13:
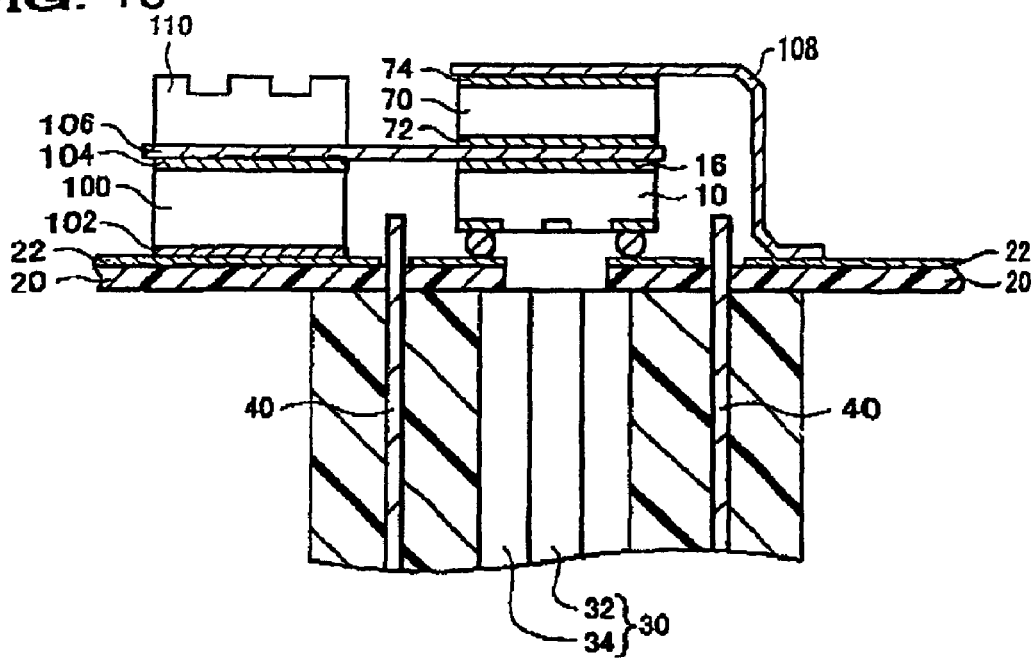
FIG. 13 shows an optical module according to a sixth embodiment to which the present invention is applied.

FIG. 13 shows an optical module according to a sixth embodiment to which the invention is applied. This optical module is provided with a heat sink 110. The other forms are similar to those of the foregoing embodiment (embodiment shown in FIG. 11). For the example shown below, the explanation to be made in other embodiments is applicable to a possible extent.

As shown in FIG. 13, a heat sink 110 is mounted on the electronic component 100 (coil in FIG. 13). Specifically, the heat sink 110 is stacked on the electronic component 100 through a conductive tape 106. Due to this, the heat of various parts (such as in the optical device 10) transferred to the heat sink 110 is dissipated thereby cooling them. Meanwhile, because the heat sink 110 is provided close to the optical device 10, the optical device 10 can be efficiently cooled down. The heat sink 110 is adhered to the coil through a not-shown adhesive. In such a case, the adhesive may have a comparatively high thermal conductivity.

Seventh Embodiment

Figure 14:
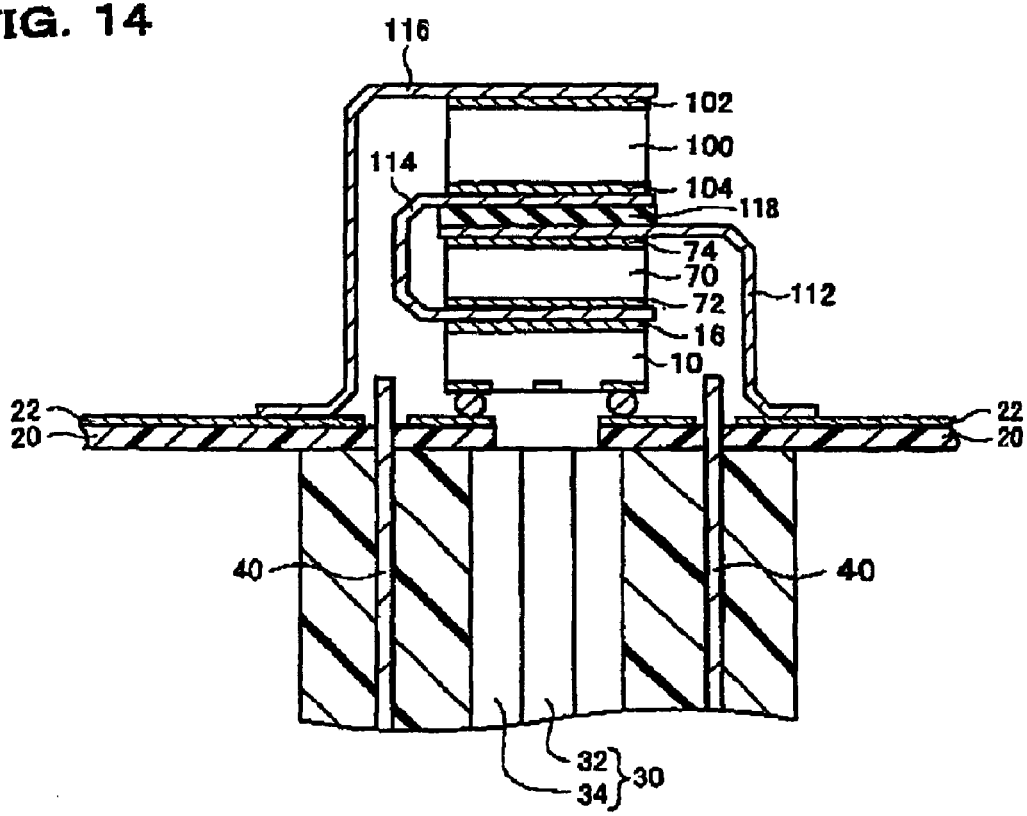
FIG. 14 is a circuit diagram explaining the optical module according to a seventh embodiment to which the present invention is applied.

FIG. 14 shows an optical module according to a seventh embodiment to which the invention is applied. For the example shown below, the explanation to be made in other embodiments is applicable to a possible extent.

In this optical module, an electronic component 70 (capacitor in FIG. 14) is mounted on the optical device 10, on which an electronic component 100 (coil in FIG. 14) is mounted. Namely, electronic components 70, 100 are stacked on the optical device 10.

The capacitor (electronic component 70) is mounted on the optical device 10, wherein the electrode 74 formed on a surface opposite to the optical device 10 is electrically connected to the conductive layer 22 of substrate 20 by a conductive tape 112. Meanwhile, the conductive tape 114 has one end sandwiched between the optical device 10 and the capacitor, and the other end connected to the electrode 104 of electronic component 100. The other end of conductive tape 114 may be sandwiched between the capacitor and the coil (electronic component 100). In such a case, the conductive tape 114 is provided on an insulating member 118 provided on the coil. The electrode 102, formed on a surface of the coil opposite to the surface facing the substrate 20, is electrically connected to the conductive layer 22 of substrate 20 through a conductive tape 116.

Due to this, because a plurality of electronic components 70 and 100 are stacked on the optical device 10, the surface area of the substrate 20 may be used more effectively. Meanwhile, where the optical device 10 uses a light-emitting device, the content shown in FIG. 12 may be applied as the equivalent circuit in the above form, thus obtaining the foregoing effect.

Note that the present embodiment satisfactorily has a plurality of electronic components stacked on the optical device 10 wherein the form thereof is not limited to the above. Meanwhile, a wire, a conductive paste or the like may be used in electrically connecting various electronic components or the optical device 10.

Eighth Embodiment

Figure 15:
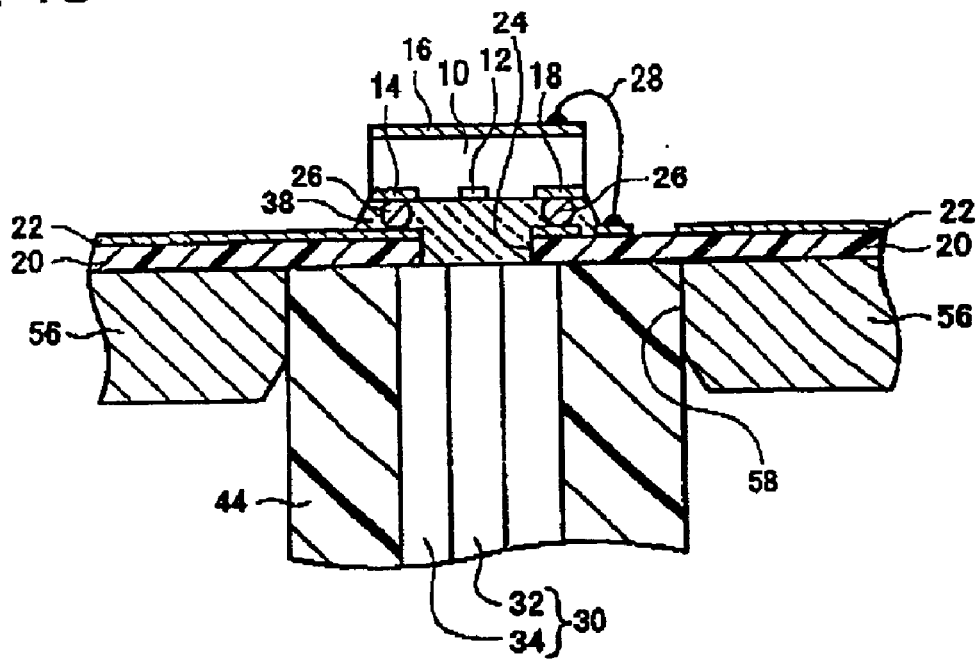
FIG. 15 shows an optical module according to an eighth embodiment to which the present invention is applied.
Figure 16:
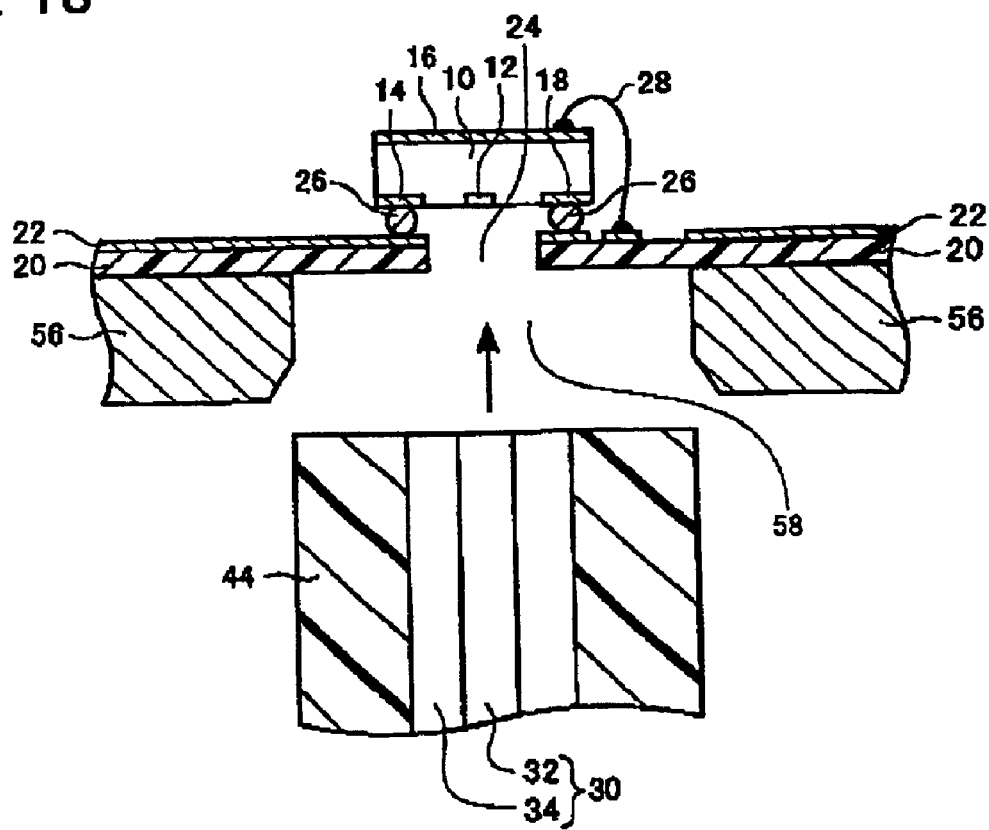
FIG. 16 shows a method of manufacturing an optical module according to an eighth embodiment to which the present invention is applied.

FIGS. 15 and 16 show an optical module according to an eighth embodiment to which the invention is applied and a method of manufacturing the same. For the example shown below, the explanation to be made in other embodiments is applicable to a possible extent.

This optical module includes an optical device 10, a substrate 20 and an optical fiber 30. The optical fiber 30 has a guide 44 at an end portion thereof. The guide 44 is used in aligning the optical fiber 30 to an optical part 12.

The guide 44 is provided covering the periphery at the end portion of the optical fiber 30 in a manner to avoid the end surface. The guide 44 may be provided one on one optical fiber 30, or provided one on a plurality of optical fibers 30. In the case of the provision on a plurality of optical fibers 30, the optical fibers 30 may be arranged side by side having their end surfaces on a same plane and axially in parallel one with another. The guide 44 maybe formed of ceramic or the like. The guide 44 may be referred to as a ferrule. Meanwhile, the optical fibers 30 have respective members (may be referred to as ferrules) at the end portions thereof so that the optical fibers 30 are collectively placed in the guide 44. The surface of guide 44 facing the optical device 10 is a planar surface, which may be flush with the end surface of the optical fiber 30. Meanwhile, the surface of guide 44 facing the optical device 10 may be circular, rectangular or other polygonal in shape.

The substrate 20 is provided with a support member 56. The support member 56 is provided on a surface of substrate 20 opposite to the surface mounting the optical device 10. The support member 56 is provided entirely or in a part on the substrate 20. The shape of the support member may be nearly in the same form as a planar form of substrate 20. The support member 56 may be formed of SUS, copper, aluminum or plastic. Meanwhile, if the support member 56 is formed of a material that has less thermal expansion than the substrate 20, it is possible to suppress the substrate 20 from expanding or shrinking due to temperature change. Note that the support member 56 may be used as a ground or shield, wherein other forms may be applied by the content of explanation made on the foregoing embodiment.

The support member 56 is formed with an aperture 58. The aperture 58 is a guide receiving section to be placed on the guide 44 for alignment. The aperture 58 of support member 56 is formed in a region including a region corresponding to the optical part 12 of optical device 10, and communicated with the aperture 24 of substrate 20. In the hole of the aperture 58 of support member 56, the guide 44 having the optical fiber 30 in its center portion is placed. The aperture 58 of support member 56 may have an outer shape nearly equal to an end surface of the guide 44 added by the optical fiber 30. This allows the guide 44 to be placed, without a gap, in the aperture 58 of support member 56, hence easily aligning the optical fiber 30 in a correct position. The support member 56 is not limited in thickness but having a thickness in a degree that the optical fiber 30 can be fixed in a predetermined position at least on a plane perpendicular to the axis of the optical fiber 30.

Meanwhile, the aperture 58 of support member 56 may have a diameter greater than the diameter of the aperture 24 of substrate 20. Due to this, in axial alignment of the optical fiber 30, the substrate 20 can be used as a stopper as shown in FIG. 15 thus facilitating alignment.

According to the optical module of this embodiment, because the support member 56 is provided on the substrate 20, the substrate 20 is suppressed from expanding or shrinking thus accurately aligning the optical fiber 30. Meanwhile, because the optical device 10 is mounted on the substrate 20, it is possible to decrease the distance between the end surface of optical fiber 30 and the optical part 12.

FIG. 16 shows a manufacturing method for an optical module according to the present embodiment. After mounting the optical device 10 on the substrate 20, the optical fiber 30 is aligned with the optical part 12 of optical device 10. The substrate 20 is provided with a support member 56 having an aperture 58. The guide 44 of optical fiber 30 is placed in the aperture 58. Where a plurality of optical devices 10 are mounted on the substrate 20, one guide 44 inserted with a plurality of optical fibers 30 may be placed in the aperture 58 of support member 56 to align the plurality of optical fibers 30 simultaneously.

According to the optical-fiber manufacturing method of this embodiment, the optical fiber 30 is aligned by placing in the aperture 58 of support member 56 the guide 44 provided in a manner covering the periphery at the end portion of the optical fiber 30. Because of requiring for the guide 44 to be merely placed in the aperture 58, the optical fiber 30 can be easily aligned.

Ninth Embodiment

Figure 17:
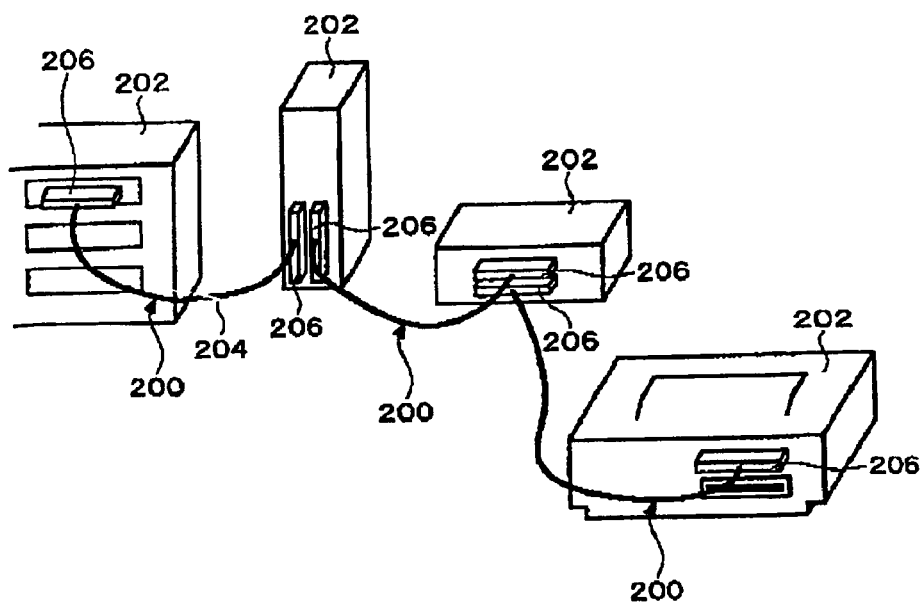
FIG. 17 shows an optical transmission device according to a ninth embodiment to which the present invention is applied.

FIG. 17 shows an optical transmission device according to a ninth embodiment to which the invention is applied. The optical transmission device 200 includes the form of the foregoing optical module, wherein an optical device 10 is provided with an optical part 12 directed to each end surface of an optical fiber 30. Specifically, the optical fiber 30 has, in one end surface, a light-emitting device having a light-emitting section directed thereto and, in the other end surface, a light-receiving device having a light-receiving section directed thereto. The light-emitting device is mounted on a first substrate while the light-receiving device is on a second substrate. By fixing the guide in the guide receiving section, alignment is made between the optical fiber 30 and the optical device 10 (light-emitting device or light-receiving device).

The optical transmission device 200 is to mutually connect between electronic units 202, such as a computer, a display, a memory device and a printer or the like. The electronic unit 202 may be an information communication unit. The optical transmission device 200 may be a cable 204 provided with plugs 206 at respective ends thereof. The cable 204 includes one or a plurality (at least one) of optical fibers 30. The plug 206 may incorporate a substrate 20 shown in FIG. 1, or the substrate 20 may be a plug 206. The plug 206 may incorporate a semiconductor chip therein.

The electric signal outputted from one electronic unit 202 is converted into an optical signal by the optical device 10 as a light-emitting device. The optical signal is transmitted through the optical fiber 30 and inputted to an optical device 10 of the other. This optical device 10 is a light-receiving device, to convert an input optical signal into an electric signal. The electric signal is inputted to an electronic unit 202 of the other. In this manner, the optical transmission device 200 of the embodiment may carry out information transmission on optical signals between the electronic units 202.

Tenth Embodiment

Figure 18:
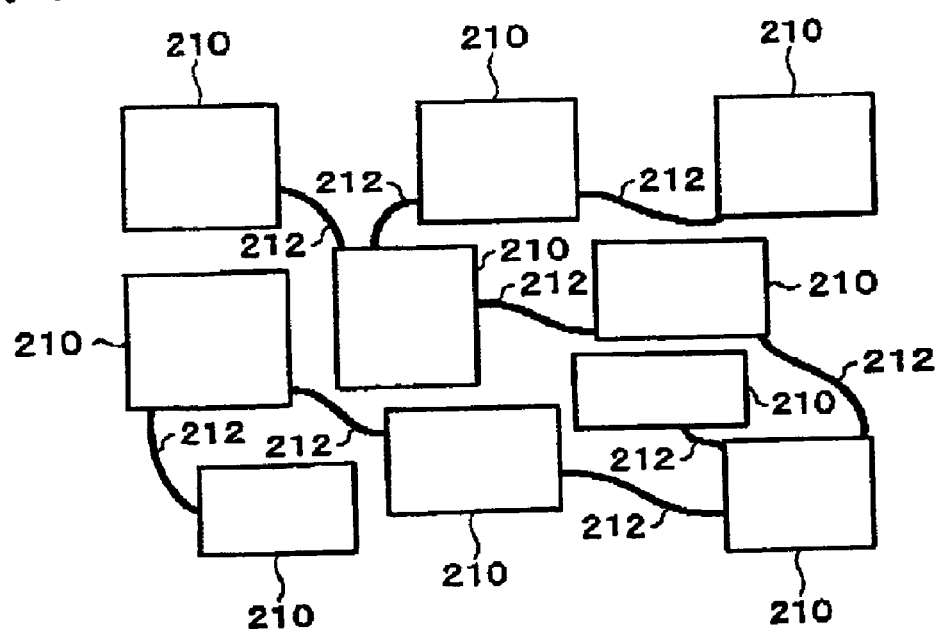
FIG. 18 shows a use form of an optical transmission device according to a tenth embodiment to which the present invention is applied.

FIG. 18 is a diagram showing a use form of an optical transmission device according to a tenth embodiment to which the invention is applied. The optical transmission device 212 connects between electronic units 210. The electronic units 210 include liquid crystal monitors or digital-compatible CRTs (possibly used in the fields of financial, mail-order sale, medical care and education), liquid crystal projectors, plasma display panels (PDP), digital TVs, retail-store registers (POS (Point of Sale scanning)), video cassette recorders, tuners, game units, printers and so on.

What is claimed is:

1. A method of manufacturing an optical module comprising:

mounting an optical device on a substrate in a manner that an optical part of the optical device faces an aperture formed in the substrate without which an optical path is not secured;

aligning an optical waveguide with its end surface facing the optical part through the aperture, the optical waveguide being provided with a fixing part surrounding an outside surface of an end portion of the optical waveguide except the end surface of the optical waveguide facing the optical part, the fixing part provided with an aligning guide projecting from a surface of the fixing part in an axial direction of the optical waveguide; and providing a light-transmissive resin in the aperture, wherein the aligning includes positioning the surface of the fixing part from which the aligning guide projects to be opposed to the substrate and attaching the guide to a guide receiving section, a position of which is determined relatively with the optical device.

2. The method of manufacturing an optical module as defined in claim 1, wherein the guide is a pin, wherein the guide receiving section is a hole formed in the substrate, and wherein the pin is inserted in the hole formed in the substrate.

3. The method of manufacturing an optical module as defined in claim 1, wherein the substrate has a support member provided on a surface opposite to a surface on which the optical device is mounted, wherein the guide receiving section is a hole formed in the support member, and wherein the guide is placed in the hole formed in the support member.

4. The method of manufacturing an optical module as defined in claim 1, further comprising mounting an electronic component on the substrate.

5. The method of manufacturing an optical module as defined in claim 4, wherein the electronic component is stacked on the optical device.

6. An optical module manufactured by the method of manufacturing an optical module as defined in claim 1.

7. A method of manufacturing an optical module comprising:

mounting an optical device on a substrate in a manner that an optical part of the optical device faces an aperture formed in the substrate without which an optical path is not secured;

aligning an optical waveguide with its end surface facing the optical part through the aperture, the optical waveguide being provided with a fixing part surrounding an outside surface of an end portion of the optical waveguide except the end surface of the optical waveguide facing the optical part, the fixing part provided with an aligning guide projecting from a surface of the fixing part in an axial direction of the optical waveguide; and providing a lens in the aperture, wherein the aligning includes positioning the surface of the fixing part from which the aligning guide projects to be opposed to the substrate and attaching the guide to a guide receiving section, a position of which is determined relatively with the optical device.

8. An optical module comprising:

a substrate;

an optical device having an optical part, the optical device mounted on the substrate with the optical part facing an aperture formed in the substrate without which an optical path is not secured;

an optical waveguide aligned in a manner that an end surface thereof faces the optical part through the aperture;

a light-transmissive resin provided in the aperture;

a fixing part provided to surround an outside surface of an end portion of the optical waveguide except the end surface of the optical waveguide facing the optical part;

an aligning guide projecting from a surface of the fixing part in an axial direction of the optical waveguide, the surface of the fixing part being opposed to the substrate; and a guide receiving section attached to the guide, a position of the guide receiving section being determined relatively with optical device.

9. The optical module as defined in claim 8, wherein the guide is a pin, wherein the guide receiving section is a hole formed in the substrate, and wherein the pin is inserted in the hole formed in the substrate.

10. The optical module as defined in claim 9, further comprising a support member provided on the substrate.

11. The optical module as defined in claim 10, wherein the support member is provided at least between the optical part and the optical waveguide, and has a lens above the optical part.

12. The optical module as defined in claim 8, further comprising a support member provided on the substrate.

13. The optical module as defined in claim 12, wherein the support member is provided at least between the optical part and the optical waveguide, and has a lens above the optical part.

14. The optical module as defined in claim 8, further comprising a support member provided on a surface of the substrate opposite to a surface on which the optical device is mounted, wherein the guide receiving section is a hole formed in the support member, and wherein the guide is placed in the hole formed in the support member.

15. The optical module as defined in claim 8, further comprising an electronic component mounted on the substrate.

16. The optical module as defined in claim 15, wherein the electronic component is stacked on the optical device.

17. An optical module comprising:

a substrate;

an optical device mounted on the substrate in a manner that a surface of the optical device on which an optical part is formed faces the substrate;

an optical waveguide aligned in a manner that an end surface thereof faces the optical part through the substrate;

an aligning guide provided at an end portion of the optical waveguide except the end surface facing the optical part;

a guide receiving section attached to the guide, a position of the guide receiving section being determined relatively with optical device; and a support member provided on the substrate, wherein the support member is formed of a material that has less thermal expansion than the substrate.

18. An optical module comprising:

a substrate;

an optical device mounted on the substrate in a manner that a surface of the optical device on which an optical part is formed faces the substrate;

an optical waveguide aligned in a manner that an end surface thereof faces the optical part through the substrate;

an aligning guide provided at an end portion of the optical waveguide except the end surface facing the optical part;

a guide receiving section attached to the guide, a position of the guide receiving section being determined relatively with optical device; and a support member provided on the substrate, wherein the guide is a pin projecting beyond the end surface of the optical waveguide in an axial direction of the optical waveguide, wherein the guide receiving section is a hole formed in the substrate, wherein the pin is inserted in the hole formed in the substrate, and wherein the support member is formed of a material that has less thermal expansion than the substrate.

19. An optical module comprising:

a substrate;

an optical device mounted on the substrate in a manner that a surface of the optical device on which an optical part is formed faces the substrate;

an optical waveguide aligned in a manner that an end surface thereof faces the optical part through the substrate;

an aligning guide provided at an end portion of the optical waveguide except the end surface facing the optical part;

a guide receiving section attached to the guide, a position of the guide receiving section being determined relatively with optical device; and a support member provided on a surface of the substrate opposite to a surface on which the optical device is mounted, wherein the guide receiving section is a hole formed in the support member, wherein the guide is placed in the hole formed in the support member, and wherein the support member is formed of a material that has less thermal expansion than the substrate.

20. An optical module comprising:

a substrate:

an optical device having an optical part, the optical device mounted on the substrate with the optical part facing an aperture formed in the substrate without which an optical path is not secured;

an optical waveguide aligned in a manner that an end surface thereof faces the optical part through the aperture;

a lens provided in the aperture;

a fixing part provided to surround an outside surface of an end portion of the optical waveguide except the end surface of the optical waveguide facing the optical part;

an aligning guide projecting from a surface of the fixing part in an axial direction of the optical waveguide, the surface of the fixing part being opposed to the substrate; and a guide receiving section attached to the guide, a position of the guide receiving section being determined relatively with optical device.

21. An optical transmission device comprising:

first and second substrates;

a light-emitting device having a light-emitting section, the light-emitting device mounted on the first substrate with the light-emitting section facing a first aperture formed in the first substrate without which a first optical path is not secured;

a light-receiving device having a light-receiving section, the light-receiving device mounted on the second substrate with the light-receiving section facing a second aperture formed in the second substrate without which a second optical path is not secured;

an optical waveguide aligned in a manner that one end surface faces the light-emitting section through the first aperture and the other end surface faces the light-receiving section through the second aperture;

a first light-transmissive resin provided in the first aperture;

a second light-transmissive resin provided in the second aperture;

first and second fixing parts provided to surround outside surfaces of end portions of the optical waveguide except the end surfaces;

first and second aligning guides respectively projecting from first and second surfaces of the first and second fixing parts in an axial direction of the optical waveguide, the first and second surfaces of the first and second fixing parts respectively being opposed to the first and second substrate; and first and second guide receiving sections respectively attached to the first and second guides, positions of the first and second guide receiving sections being determined relatively with the light-emitting device and the light-receiving device, respectively.

22. The optical transmission device as defined in claim 21, further comprising:

a plug to be connected to the light-receiving device; and a plug to be connected to the light-emitting device.

* * * * *